United States Patent

Shirahama

(10) Patent No.: US 7,544,611 B2
(45) Date of Patent: Jun. 9, 2009

(54) METHOD OF MANUFACTURING III-V NITRIDE SEMICONDUCTOR DEVICE

(75) Inventor: Takeo Shirahama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 87 days.

(21) Appl. No.: 11/935,494

(22) Filed: Nov. 6, 2007

(65) Prior Publication Data

US 2008/0318422 A1    Dec. 25, 2008

(30) Foreign Application Priority Data

Jun. 25, 2007    (JP) .............................. 2007-166597

(51) Int. Cl.
*H01L 21/3065* (2006.01)

(52) U.S. Cl. ...................... 438/667; 438/718; 438/931; 257/E21.06; 257/E21.222

(58) Field of Classification Search .................. 438/46, 438/77, 93, 285, 604, 667, 718, 931, FOR. 130, 438/FOR. 131, FOR. 139, FOR. 267, FOR. 293; 257/E21.06, E21.222, E23.011, E23.067
See application file for complete search history.

(56) References Cited

U.S. PATENT DOCUMENTS

| | | | |
|---|---|---|---|
| 6,239,033 B1 | 5/2001 | Kawai | |
| 7,161,188 B2 * | 1/2007 | Orita | 257/98 |
| 2004/0063236 A1 * | 4/2004 | Kwak et al. | 438/39 |
| 2005/0048739 A1 * | 3/2005 | Kerdiles et al. | 438/458 |
| 2007/0200116 A1 * | 8/2007 | Harris et al. | 257/77 |
| 2008/0067562 A1 * | 3/2008 | Kawasaki | 257/289 |
| 2008/0286963 A1 * | 11/2008 | Krueger et al. | 438/637 |
| 2008/0318422 A1 * | 12/2008 | Shirahama | 438/672 |

FOREIGN PATENT DOCUMENTS

| | | |
|---|---|---|
| JP | 60-161651 A | 8/1985 |
| JP | 11-45892 A | 2/1999 |
| JP | 2001-77128 A | 3/2001 |

\* cited by examiner

*Primary Examiner*—George Fourson
(74) *Attorney, Agent, or Firm*—Leydig, Voit & Mayer, Ltd.

(57) ABSTRACT

An aluminum gallium nitride/gallium nitride layer (III-V nitride semiconductor layer) is formed on the surface of a silicone carbide substrate. The aluminum gallium nitride/gallium nitride layer is dry-etched from an exposed surface, using a chlorine-based gas (first gas) and a surface via hole is thereby formed. A back via hole, which is to be connected to the surface via hole, is formed by dry-etching the silicon carbide substrate from an exposed back side using a fluorine-based gas (second gas).

6 Claims, 3 Drawing Sheets

METHOD OF MANUFACTURING III-V NITRIDE SEMICONDUCTOR DEVICE

BACKGROUND OF THE INVENTION

1. Field of the Invention

The present invention relates to a method of manufacturing a semiconductor device for forming a III-V nitride semiconductor layer on the surface of a silicon carbide substrate and forming via holes which penetrate both, and more particularly, to a method of manufacturing a semiconductor device capable of miniaturizing elements formed on the surface side in particular and speeding up via hole work.

2. Background Art

High-frequency transistors and MMIC (Microwave Monolithic Integrated Circuit) using compound semiconductor are used (e.g., see Japanese Patent Laid-Open No. 2001-77128). The characteristics of these semiconductor devices are significantly influenced by a via hole forming process.

A conventional via hole forming process will be explained. First, a III-V nitride semiconductor layer is formed on the surface of a silicon carbide substrate and elements on the surface are formed. Next, the surface side of a wafer is pasted to a support substrate of sapphire or the like and the thickness of the wafer is reduced through grinding. The silicon carbide substrate and the III-V nitride semiconductor layer are then dry-etched from the back side and via holes penetrating both are thereby formed at once.

However, according to the conventional method, when the diameter of a via hole is reduced to miniaturize elements formed on the surface side, the aspect ratio (ratio of the diameter of an etched part to the depth of etching) increases. Since silicon carbide is a member hard to be etched and the etching rate when worked through dry etching is low, a large aspect ratio requires a long time for via hole work. On the other hand, when the diameter of the via hole is increased to reduce the aspect ratio, the elements formed on the surface side cannot help but be increased in size.

SUMMARY OF THE INVENTION

The present invention has been implemented to solve the above described problems and it is an object of the present invention to provide a method of manufacturing a semiconductor device capable of miniaturizing elements formed on the surface side and speeding up via hole work.

According to one aspect of the present invention, a method of manufacturing a semiconductor device comprises a step of forming a III-V nitride semiconductor layer on a surface of a silicon carbide substrate; a step of forming a surface via hole by selectively dry-etching the III-V nitride semiconductor layer from the surface side using a first gas; and a step of forming a back via hole which is to be connected to the surface via hole by selectively dry-etching the silicon carbide substrate from the back side using a second gas.

The present invention makes it possible to miniaturize elements formed on the surface side and speed up via hole work.

DETAILED DESCRIPTION OF THE PREFERRED EMBODIMENTS

Embodiment 1

Hereinafter, a method of manufacturing a semiconductor device according to Embodiment 1 of the present invention will be explained using drawings.

Figure 1:
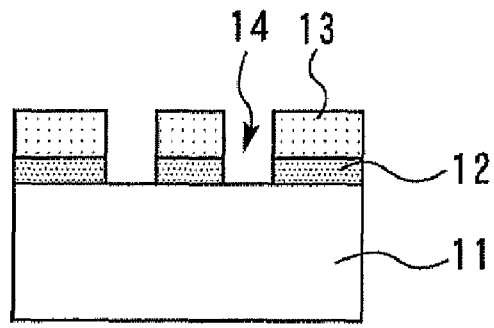
FIGS. 1-6 are sectional views for explaining a method of manufacturing a semiconductor device according to Embodiment 1 of the present invention.

First, as shown in FIG. 1, an aluminum gallium nitride/gallium nitride layer 12 (III-V nitride semiconductor layer) of several μm in thickness is formed on the surface of a silicon carbide substrate 11 of several tens of μm to several hundreds of μm in thickness. A resist 13 is then formed on the aluminum gallium nitride/gallium nitride layer 12 and the resist 13 is patterned.

Using this resist 13 as a mask, the aluminum gallium nitride/gallium nitride layer 12 is dry-etched and penetrated from the surface side using a chlorine-based gas (first gas) such as boron trichloride, silicon tetrachloride, chlorine gas and a surface via hole 14 is thereby formed. The resist 13 is then removed.

Here, since the chlorine-based gas is not the etchant of silicon carbide, the aluminum gallium nitride/gallium nitride layer 12 is selectively etched with respect to the silicon carbide substrate 11 using a chlorine-based etchant. This embodiment sets etching conditions such as the composition of the chlorine-based gas so that, for example, the etching selection ratio of the aluminum gallium nitride/gallium nitride layer 12 to the silicon carbide substrate 11 becomes 5 or more. However, not only the chlorine-based gas but any kind of gas can be used if it allows the aluminum gallium nitride/gallium nitride layer 12 to be selectively etched with respect to the silicon carbide substrate 11. Furthermore, using a chlorine-based gas that has a side-wall protection effect causes a reaction product to be adhered to the side wall and can thereby prevent side etching.

Figure 2:
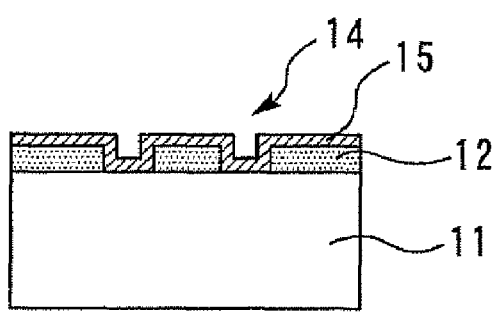

Next, as shown in FIG. 2, the surface via hole 14 is coated with a metallic layer 15 made of a multilayered film containing, for example, titanium and gold. An element (not shown) having, for example, an HEMT (High Electron Mobility Transistor) structure is formed in the aluminum gallium nitride/gallium nitride layer 12 on the surface side.

Figure 3:
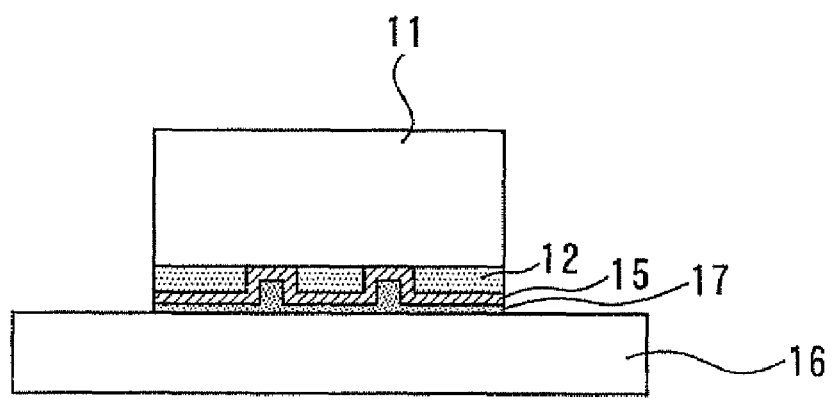

Next, as shown in FIG. 3, a resist and semiconductor wax 17 of 10 μm in thickness is applied to the surface of the surface via hole 14 and pasted to a sapphire support substrate 16.

Figure 4:
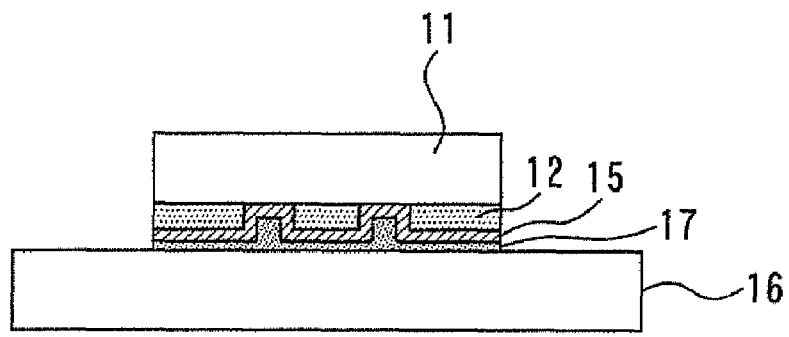

Next, as shown in FIG. 4, the back of the silicon carbide substrate 11 is subjected to grinding and polishing to reduce the thickness of the silicon carbide substrate 11. The thickness of the silicon carbide substrate 11 is adjusted to several tens of μm to 100 μm according to the characteristic of the element.

Figure 5:
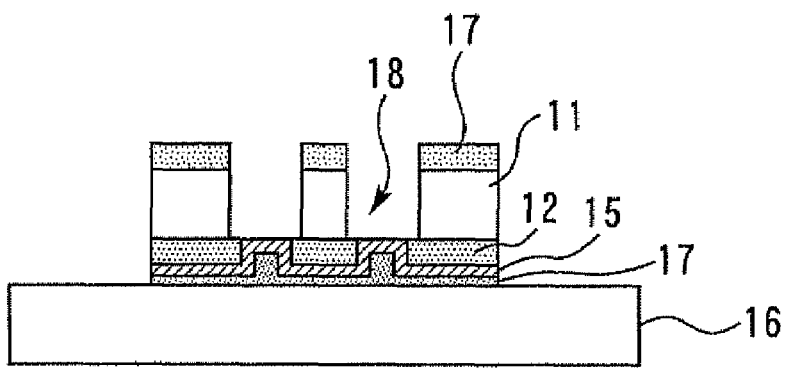

Next, as shown in FIG. 5, a nickel layer 17 is formed on the back of the silicon carbide substrate 11 using a vapor deposition, sputtering or plating method and the nickel layer 17 is patterned. Here, when a mixed gas of sulfur hexafluoride and oxygen is used as the etching gas, nickel is suitable as the etching mask because it has a selection ratio of approximately 30 or more with respect to silicon carbide.

Using this nickel layer 17 as the mask, the silicon carbide substrate 11 is dry-etched and penetrated from the back side using a fluorine-based gas (second gas) to thereby form a back via hole 18 which is to be connected to the surface via hole 14. Here, since the fluorine-based gas is not the etchant of the III-V nitride semiconductor, the fluorine-based etchant causes the silicon carbide substrate 11 to be selectively etched with respect to the aluminum gallium nitride/gallium nitride layer 12. This embodiment sets the etching conditions such as the composition of the fluorine-based gas so that the etching selection ratio of the silicon carbide substrate 11 to the aluminum gallium nitride/gallium nitride layer 12 becomes 5 or more, for example. However, not only the fluorine-based gas but any gas can be used if it allows the silicon carbide substrate 11 to be selectively etched with respect to the aluminum gallium nitride/gallium nitride layer 12. Furthermore, since the surface via hole 14 is coated with the metallic layer 15 before forming the back via hole 18, this metallic layer 15 stops the etching of the silicon carbide substrate 11. After that, the nickel layer 17 is removed with acid.

Figure 6:
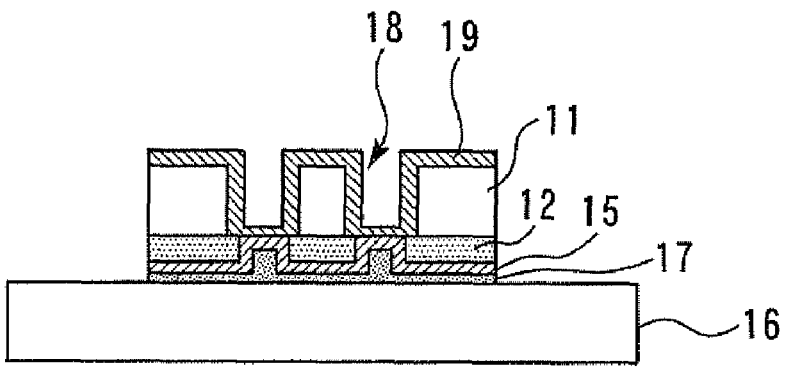

Next, as shown in FIG. 6, a titanium/gold layer (not shown) is vapor-deposited into the back via hole 18 and the top surface thereof is coated with a metallic layer 19 which consists of a gold plated layer/nickel plated layer. Coated with the nickel plated layer in this way, when die-bonding is applied thereto using solder made of a gold-tin alloy in a subsequent assembly process, nickel and tin form an alloy and can thereby enhance the bonding strength. The semiconductor device according to this embodiment is manufactured in the above described processes.

Since the aluminum gallium nitride/gallium nitride layer 12 is thinner than the silicon carbide substrate 11, even when the diameter of the surface via hole 14 is reduced, the aspect ratio is small and can be etched relatively easily. Therefore, elements to be formed on the surface side can be miniaturized. Furthermore, since the size of the elements to be formed on the surface side is already fixed at the time of working of the back via hole 18, it can be controlled without depending on the working condition of the back via hole 18.

Furthermore, even when the aspect ratio is reduced by making the diameter of the back via hole 18 greater than the diameter of the surface via hole 14 to facilitate etching, the size of the element formed on the surface side is already fixed and remains unaffected. This can speed up the via hole work.

Furthermore, when the silicon carbide substrate and the III-V nitride semiconductor layer are penetrated from the back side at once as in the case of the conventional art, a chlorine-based reaction product inevitably adheres to the side wall of the via hole of silicon carbide. For this reason, the reaction product needs to be removed through wet etching or the like. When the removal is insufficient, there can be a problem that the metallic film which coats the via hole may be peeled off. On the other hand, such a problem never occurs in this embodiment because the side wall of the via hole of silicon carbide is not exposed to plasma caused by the chlorine-based gas.

Furthermore, the side wall of the via hole of silicon carbide is exposed to plasma caused by the fluorine-based gas during work on the back via hole. However, since side etching of silicon carbide need not be considered, the fluorine-based gas which has no side wall protection effect can be used. This makes it possible to reduce the reaction product which adheres to the side wall of the via hole of silicon carbide.

Embodiment 2

Hereinafter, a method of manufacturing a semiconductor device according to Embodiment 2 of the present invention will be explained using drawings.

Figure 7:
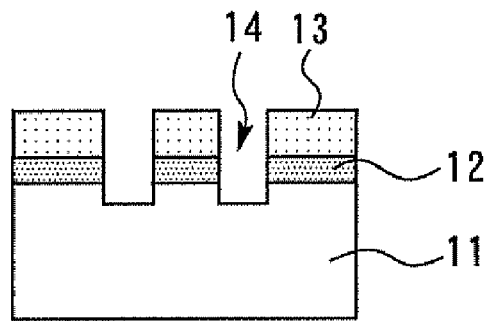
FIGS. 7-9 are sectional views for explaining a method of manufacturing a semiconductor device according to Embodiment 2 of the present invention.

As shown in FIG. 7, in the process of forming a surface via hole 14 in this embodiment, an aluminum gallium nitride/gallium nitride layer 12 is dry-etched and penetrated from the surface side using a chlorine-based gas and then the chlorine-based gas is changed to a fluorine-based gas (second gas) and a silicon carbide substrate 11 is dry-etched halfway from the surface side. As in the case of Embodiment 1, the surface via hole 14 is then coated with a metallic layer 15, pasted to a sapphire support substrate 16 and the thickness of the silicon carbide substrate 11 is reduced.

Figure 8:
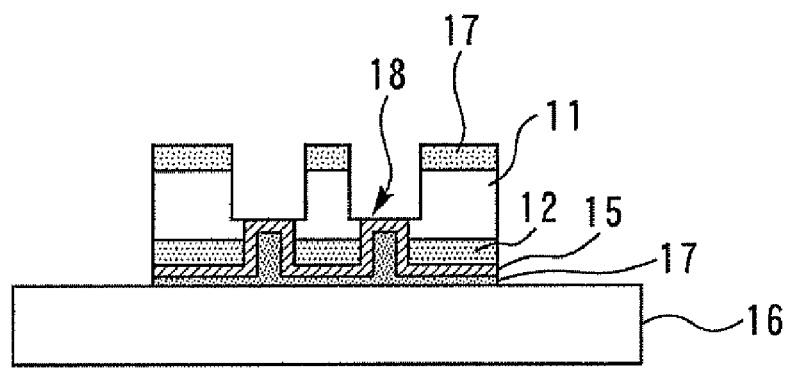

Next, as shown in FIG. 8, using a nickel layer 17 as a mask, the silicon carbide substrate 11 is dry-etched and penetrated from the back side using a fluorine-based gas and a back via hole 18 which is to be connected to the surface via hole 14 is thereby formed.

Figure 9:
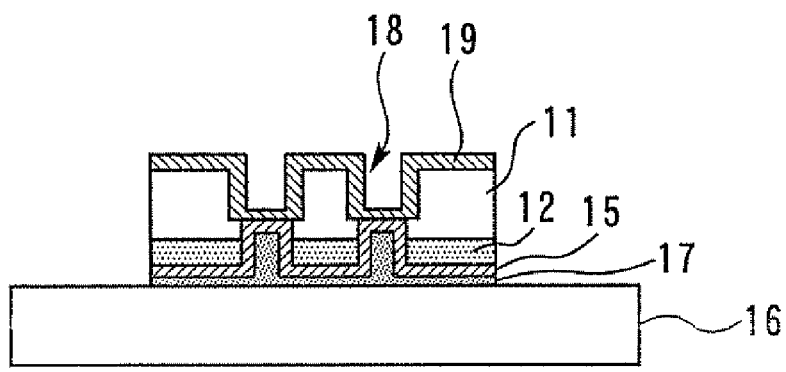

Next, as shown in FIG. 9, a titanium/gold layer (not shown) is vapor-deposited into the back via hole 18 and the top surface thereof is coated with a metallic layer 19 made of a gold plated layer/nickel plated layer. Other processes are the same as those in Embodiment 1.

This embodiment not only exerts the same effects as those in Embodiment 1 but also reduces the thickness of the silicon carbide substrate 11 to be etched during work on the back via hole 18, and can thereby reduce the aspect ratio and further speed up work on the via hole.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-166597, filed on Jun. 25, 2007 including specification, claims, drawings and summary, on which the Convention priority of the present application is based, are incorporated herein by reference in its entirety.

What is claimed is:

1. A method of manufacturing a semiconductor device comprising:
    forming a III-V nitride semiconductor layer on a surface of a silicon carbide substrate;
    forming a surface via hole by selectively dry-etching the III-V nitride semiconductor layer from a surface side, using a first gas; and
    forming a back via hole which is to be connected to the surface via hole, by selectively dry-etching the silicon carbide substrate from a back side, using a second gas.

2. The method of manufacturing a semiconductor device according to claim 1, wherein, in forming the surface via hole, the III-V nitride semiconductor layer is dry-etched from the surface side, using the first gas, and then the silicon carbide substrate is dry-etched from the surface side, using the second gas.

3. The method of manufacturing a semiconductor device according to claim 1, further comprising coating the surface via hole with a metallic layer before forming the back via hole.

4. The method of manufacturing a semiconductor device according to claim 1, wherein the back via hole has a larger diameter than the surface via hole.

5. The method of manufacturing a semiconductor device according to claim 1, wherein the first gas and the second gas are a chlorine-based gas and a fluorine-based gas, respectively.

6. The method of manufacturing a semiconductor device according to claim 5, wherein the fluorine-based gas is a gas producing no side wall protection effect.

* * * * *